United States Patent [19]

Van Gieson et al.

[11] Patent Number: 4,700,353
[45] Date of Patent: Oct. 13, 1987

[54] ACTIVE MODULATION OF QUANTUM WELL LASERS BY ENERGY SHIFTS IN GAIN SPECTRA WITH APPLIED ELECTRIC FIELD

[75] Inventors: Edward Van Gieson, Ithaca; Gary W. Wicks, New Field; Eric Elias; Lester F. Eastman, both of Ithaca, all of N.Y.

[73] Assignee: Cornell Research Foundation, Inc., Ithaca, N.Y.

[21] Appl. No.: 764,704

[22] Filed: Aug. 12, 1985

[51] Int. Cl.⁴ .......................... H01S 3/10; H01S 3/19
[52] U.S. Cl. ...................................... 372/26; 372/45; 372/46; 372/47; 372/50
[58] Field of Search .................. 372/26, 45, 46, 50, 372/47; 357/17

[56] References Cited

U.S. PATENT DOCUMENTS

| | | | |
|---|---|---|---|
| 3,301,625 | 1/1967 | Ashkin et al. | 372/44 |
| 3,431,512 | 3/1969 | Redfield | 372/49 |
| 3,702,975 | 11/1972 | Miller | 372/46 |
| 3,768,037 | 10/1973 | Migitaka et al. | 372/46 |
| 3,815,045 | 6/1974 | Ito | 372/26 |
| 3,959,808 | 5/1976 | King | 357/17 |
| 3,973,216 | 8/1976 | Hughes | 372/26 |
| 3,999,146 | 12/1976 | Lang et al. | 372/50 |
| 4,093,345 | 6/1978 | Logan et al. | 372/46 |
| 4,359,773 | 11/1982 | Swartz et al. | 372/26 |
| 4,408,330 | 10/1983 | An | 372/45 |
| 4,603,420 | 7/1986 | Nishizawa et al. | 372/50 |

OTHER PUBLICATIONS

Appl Phys. Lett., vol. 42, No. 10, May 15, 1983, pp. 864, 865, 866, "Electroabsorption by Stark Effect on Room-Temperature Excitons . . . ".
Electronics Letters, Mar. 17, 1983, vol. 19, No. 6, pp. 210, 211 "Gain Spectra of Quantum-Well Lasers".
Physical Review B, vol. 26, No. 12, Dec. 15, 1982, "Effect of an Electric Field on the Luminescence of GaAs Quantum Wells".
Japanese Journal of Applied Physics, vol. 22, No. 1, Jan. 1, 1983, pp. L22-L24, "Quantum Mechanical Size Effect Modulation Light Sources— . . . ".

Primary Examiner—James W. Davie
Attorney, Agent, or Firm—Jones, Tullar & Cooper

[57] ABSTRACT

Modulation of a semiconductor laser device is achieved at microwave frequencies by the application of transverse fields which produce energy shifts in the gain spectra of the laser device. The laser device is a PN diode which has a body portion constructed from a nonconductive material, with P and N type implants on opposite sides. The P and N implants define a transition region, or layer, on the order of 1 micron in width, in which is formed a quantum well having a thickness on the order of 50 to 100 Angstroms. Application of a bias voltage across the PN junction provides lasing of the device. An electrode on the surface of the transition layer allows application of a transverse electric field to the PN junction. This transverse field quenches the lasing of the device, to provide modulation of the laser. Quenching is produced by means of energy shifts in the gain spectra of the laser device, and since current flow through the PN junction is inhibited by the nonconductive material and thus flows primarily in the quantum wells, modulation of the current is possible at microwave frequencies at relatively low power levels.

16 Claims, 28 Drawing Figures

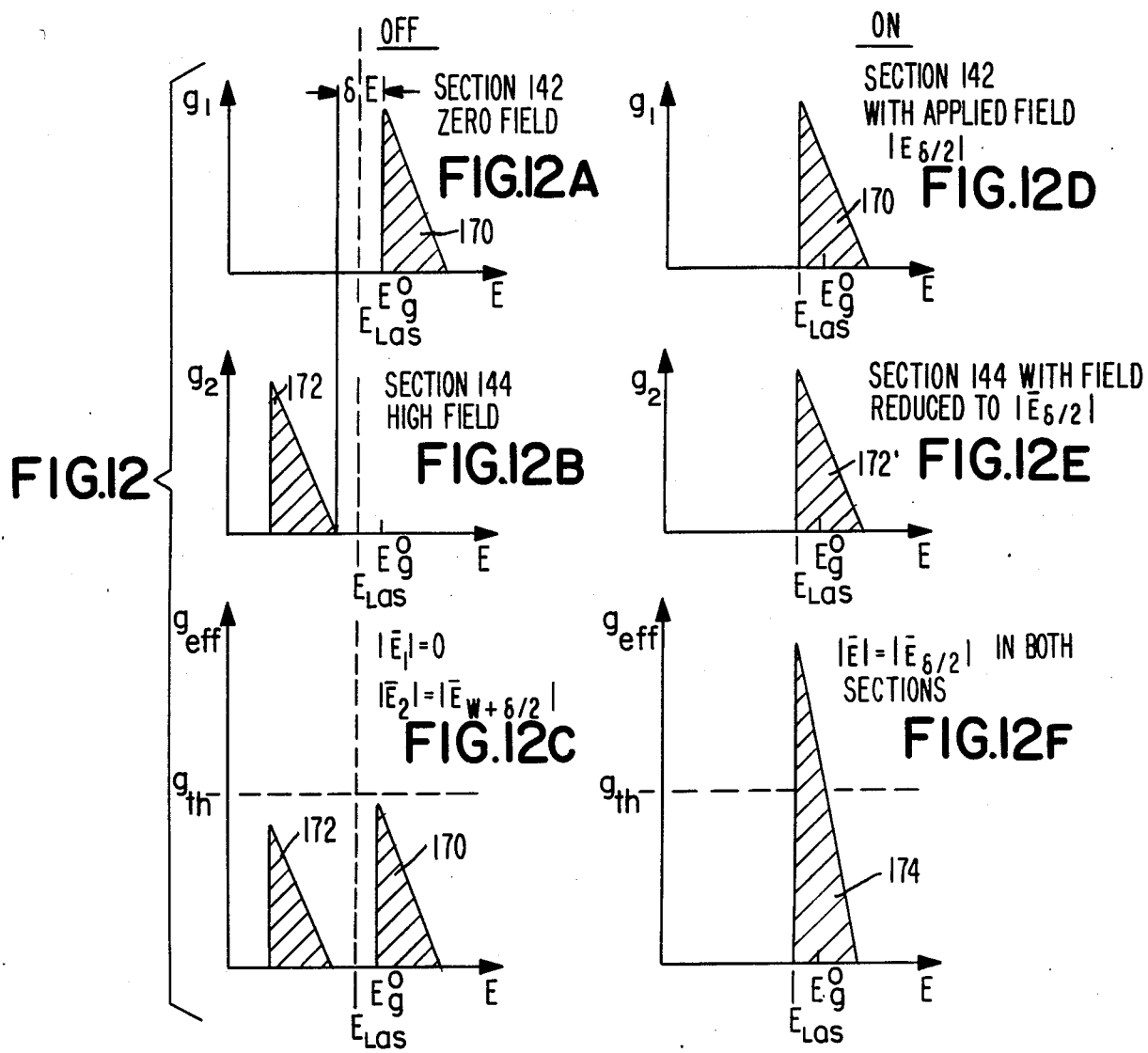
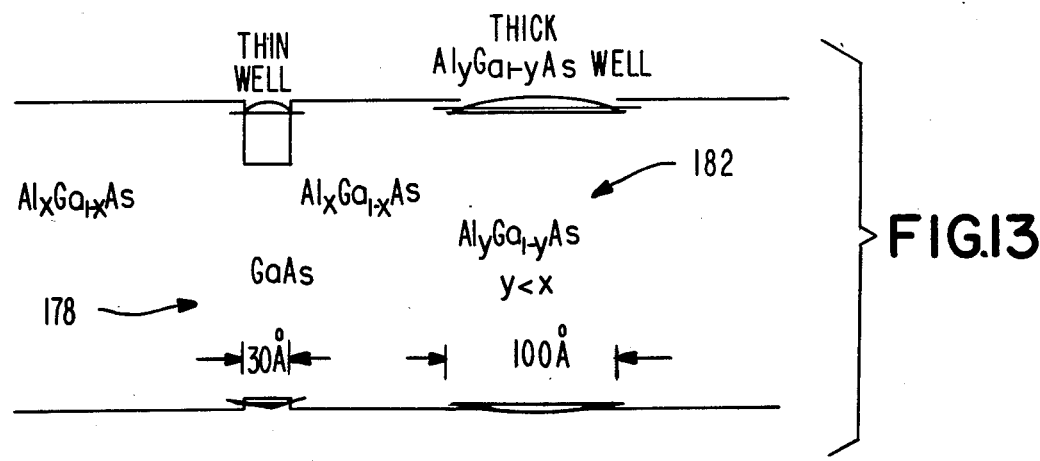

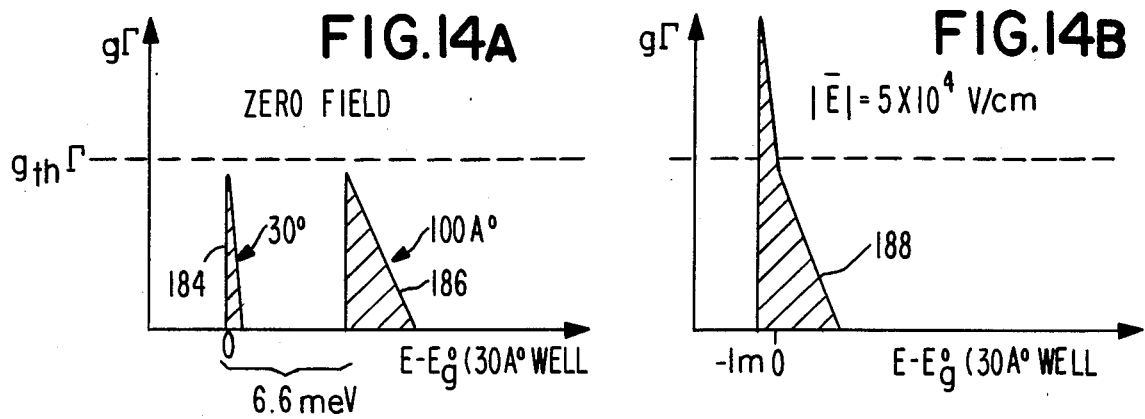
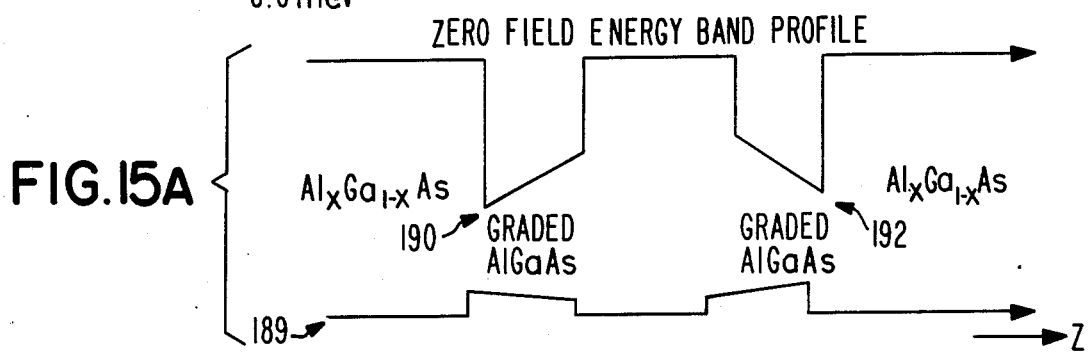
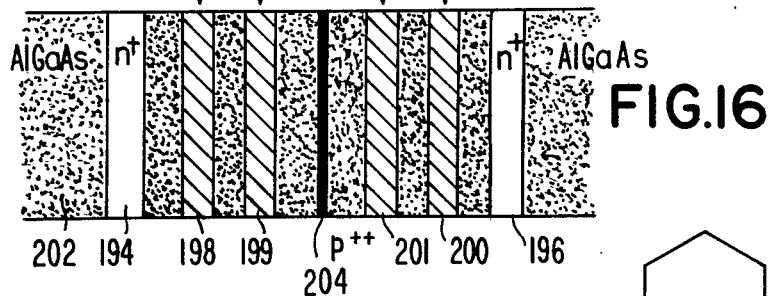
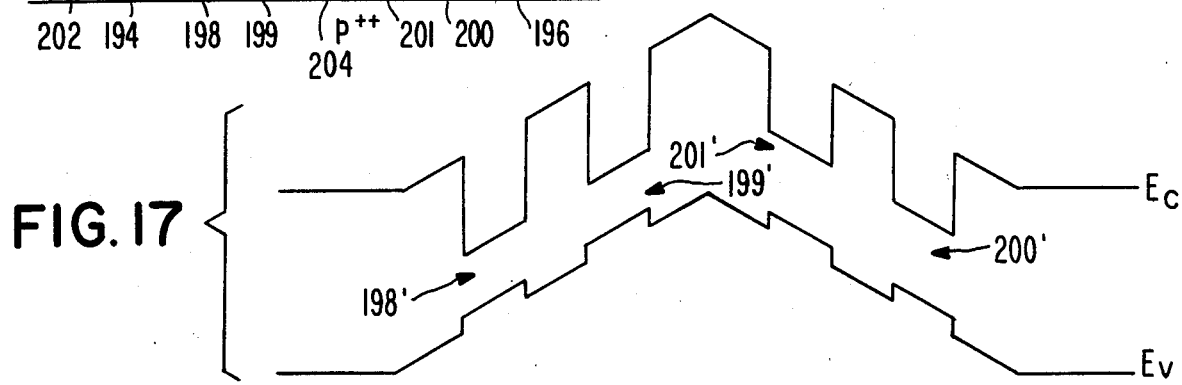

ACTIVE MODULATION OF QUANTUM WELL LASERS BY ENERGY SHIFTS IN GAIN SPECTRA WITH APPLIED ELECTRIC FIELD

BACKGROUND OF THE INVENTION

The present invention is directed to high-frequency modulation of semiconductor lasers, and, more particularly, to the use of electric fields applied in a direction normal to the direction of current flow in the quantum wells of a semiconductor laser to modulate such a laser through energy level shifting.

Semiconductor lasers have several important features, including extreme monochromaticity and high directionality (or time and space coherence, respectively), which features are generally similar to those of other lasers. However, solid state junction lasers differ from other lasers in several basic respects. First, the quantum transition of a solid state junction laser occurs between energy bands (conduction and valence bands), rather than between discrete energy levels, as is the case in the solid state ruby laser. Further, the size of a solid state junction laser is very small, and its characteristics are strongly influenced by the properties of the junction material, such as doping, and band tailing. Population inversion in a solid state junction laser takes place in the very narrow junction region, and the pumping is supplied by a forward bias across the junction. Recently, semiconductor devices known as quantum well lasers have attracted technological interest due to their low threshold currents, greater insensitivity of threshold current with respect to temperature, and potential fiber optic communication applications. A quantum well may be defined as a restricted area within the transition layer of the junction where electrons form standing waves, with the width of the quantum well determining the energy level of the electrons, and thus controlling the frequency of light emitted by the laser device.

Quantum well lasers exhibit novel properties, compared to those of conventional lasers, and these properties have useful applications. For example, the high density of states at the quantum well band edge can be exploited to give very low threshold currents. However, the problem of optimizing the design of a device becomes complex, because many more parameters are involved than in conventional semiconductor lasers. For example, the well width, the number of wells, and the composition and thickness of the layers separating the wells must all be taken into consideration. Known quantum well lasers consist of a very thin layer (on the order of less than 500 Angstroms) of a low band-gap semiconductor material sandwiched between higher band-gap semiconductor layers. The resulting energy band profile for such a device results in the confinement of the electric carriers and the formation of discreet energy states. It was shown by E. E. Mendez, et al. ("Effect of Electric Field on the Luminescence of GaAs Quantum Wells," Physical Review, Vol. 26, no. 12, Dec. 15, 1982, pp. 7101-7104), that significant effects on the carrier confinement and energy states of the quantum well could be produced by means of external parameters such as an electric field applied perpendicularly. It was shown that the field polarized the electron and hole distribution to opposite sides of the quantum well along the direction of the field, or against the direction of the field, depending on the sign of the charge, with the result that the quantum states experienced an energy shift. It was proposed by Mendez, et al., that such effects could be used for control and modulation of the photon energy and the intensity output of a radiation-emitting device based on quantum wells.

It was also shown by Yamanishi, et al. (Japanese Journal of Applied Physics, Vol. 22, No. 1, January 1983, pp.L22-L24), that a direct modulation of the perpendicular electric field in such a quantum well laser could be used to modulate the light output intensity. Yamanishi, et al., proposed a field effect laser, or light-emitting diode, where the photon emission rate was controlled by a gate voltage. This control was obtained mainly through changes in spatial distributions of the carriers, or, what is the same, by the quantum mechanical size effect modulations for the wave functions of the carriers, while keeping the carrier concentration per unit area substantially constant.

Although such devices have represented significant steps in the development of this art, problems have been discovered in operating such devices at microwave frequencies. First of all, devices such as those proposed by Yamanishi, et al., require high electric fields to achieve a significant reduction in gain, particularly in the case of narrow quantum wells. This is because an electric field, in reducing the subband energies causes more charge to flow into the quantum well, and this serves to increase the carrier density and the peak gain. In addition, undesirable leakage current conduction through the semi-insulating barrier layer or the tunneling of carriers to the control gate used to provide the electric field, both can pose serious problems at the high fields required to modulate a narrow quantum well laser. Thus, such prior devices require large microwave frequency currents to produce modulation and a large displacement current within the device itself. At frequencies of 40 GHz or more, current densities on the order of several thousand amperes per square centimeter would be needed to modulate a single quantum well laser.

SUMMARY OF THE INVENTION

It is an object of the present invention to produce a modulated quantum well semiconductor laser having improved operational characteristics.

It is a further object of the present invention to provide a quantum well laser device which can be modulated at microwave frequencies, but which does not require large currents to produce such modulation, and further does not result in large displacement currents within the device.

In accordance with the present invention, a semiconductor laser structure is constructed from a high bandgap material such as AlGaAs, which is undoped to avoid current conduction in it. Implants of P+ type material and N+ type material form a PN junction having an intermediate transition layer in the AlGaAs material. The implants inject electrons and holes into quantum wells formed between the P and N junctions and within the undoped transition layer. The injection of electrons and holes provides the necessary inversion for laser operation. The fraction of current entering the quantum wells, as compared to that entering the high band-gap material, is dependent on the width of the quantum wells and on a Boltzman factor, $e^{-\Delta E/kT}$, where $\Delta E$ is the difference in bandgap between the P+ and N+ type semiconductors. If, in the case of the AlGaAs system, a high enough mole fraction of aluminum is chosen for the barrier regions, a negligible fraction of the current entering the quantum wells will flow through the undoped transition layer of AlGaAs upon application of a modulating transverse electric field.

The energy band profile for a quantum well semiconductor laser including a low band-gap semiconductor material sandwiched between higher band-gap materials results in an energy band profile for electrons and holes which may be defined, for an infinitely deep potential well as follows:

$$\psi_n(z) = A \sin \frac{n\pi z}{L_z} \quad 0 < z < L_z \tag{1}$$

$$0 \quad z < 0; z > L_z \tag{2}$$

$$E_n = \frac{\hbar^2 \pi^2}{2m^*} \left(\frac{n}{L_z}\right)^2, \tag{3}$$

where $L_z$ is the thickness of the quantum well, as measured along the axis of growth of the well, m* is the effective mass, $\hbar$ is Planck's constant, divided by $2\pi$, and where n is an integer quantum number. Quantum wells with finite potential barriers have sinusoidal solutions in the well, and exponentially decaying wave functions in the barrier. In such a case, an Eigenvalue equation has to be solved for $E_n$ which is derived from the continuity of the wave function and its derivatives at the interfaces. The energy of a confined state of an electron in a quantum well is as follows:

$$E = E_n + \frac{\hbar^2}{2m^*}(K_x^2 + K_y^2), \tag{4}$$

where $\hbar K_x$ and $\hbar K_y$ are the crystal momentum of the electrons in the x and y directions. Each of the subbands with quantum number n has a density of states independent of energy, giving rise to a cumulative density of states for a series of subbands that is step-like in nature.

The step-like density of states in the subbands of a quantum well will produce an optical gain versus energy characteristic curve which is significantly narrower than the gain versus energy curve of material which does not exhibit the quantum well characteristics when such material is biased to a comparable peak gain. The optical gain for a quantum well laser device, as a function of photon energy $h\nu$ can be written as follows:

$$g(h\nu) = \frac{\pi h}{\bar{n} c \epsilon_0 (h\nu)} \left(\frac{e}{m}\right)^2 |M|^2 \left(\frac{m_r}{\pi L \hbar^2}\right)(f_c - f_v) \tag{5}$$

where $m_r$ is the reduced electron mass, L is the well width, $\bar{n}$ is the refractive index of the material forming the well, $f_c$ and $f_v$ are the Fermi-Dirac occupation probabilities for conduction and valence band states involved in the stimulated emission and absorption of photon energy $h\nu$, M is a momentum matrix element between the lowest conduction band state and highest valence band state, and the rest of the symbols have their usual meanings. In undoped material, the conservation of both energy and $K_x$ and $K_y$ is assumed, along with the $\Delta n = 0$ selection rule to evaluate the gain.

The optical gain vs. energy curves for quantum wells in a GaAs-GaAlAs system for different well sizes was calculated by M. G. Burt ("Gain Spectrum of Quantum Well Lasers," Electronics Letters, vol. 10, No. 6, pp. 210-211, March 17, 1983). These calculations show that the gain curves are essentially linear, and can be approximated as having slopes which are independent of the peak gain. If the peak gain is assumed to be 100 cm.$^{-1}$, it is found that the gain curves are on the order of a few meV. The constant slope approximation allows these curves to be scaled up to the magnitude of the actual peak gain obtained from a device, and this scaling produces gain curves having widths which also scale with the width of the quantum wells in the devices. This approximation is not exact for wide wells or for high-carrier densities, where the gain curve is broadened at a rate somewhat greater than the scaled width of the wells.

If an electric field is applied to a quantum well device in a direction which is normal to the direction of current flow in the well, a slope is produced in the potential energy of the well, so that the electrons and holes in the device will see triangular potential wells with minima at opposite ends of the well for the different carriers. If a strong enough field is applied, the electron and hole wave functions are localized to opposite sides of the well. This polarization by a high electric field can reduce the peak gain of the device, as was illustrated by Mendez, et al. (ibid.), who conducted photoluminescence experiments with quantum wells located in the depeletion region of a Schottky diode. At low perpendicular fields, the photoluminescent spectra showed two peaks associated, respectively, with exciton, and with free electron-to-impurity recombinations. Under an increasing field, the photoluminescent intensity decreased, with the excitonic peak decreasing at a much faster rate, and becoming completely quenched at a field of a few tens of kv per cm. This was accompanied by a shift in the position of the two peaks to lower energies. The reduction in the peak gain required a high electric field, and in devices of the type discussed by Mendez, et al., narrow wells required a prohibitively high electric field in order to quench the gain.

The provision of an electric field across a quantum well also has the secondary effect of shifting the subband energies. Yamanishi, et al. (ibid.), have calculated a relatively large shift of the subband energies under a high electric field, and have proposed a device which applies a homogeneous electric field across a single quantum well, modulating it by polarizing the carriers and reducing the overlap integral. As pointed out above, however, there are many problems with the microwave frequency operation of such a device, for such a device requires high fields to achieve a significant reduction in gain, especially for narrow quantum wells. The electric field, in reducing the subband energies relative to quasi Fermi energies, will cause more charge to flow into the well, increasing the carrier density, and increasing the peak gain. Current conduction through a semi-insulating barrier layer or tunnelling of carriers to the gate electrode applying the perpendicular electric field pose problems at the high fields it would take to modulate a narrow quantum well laser with the scheme proposed by Yamanishi, et al. Further, such a device would also require a large microwave current in order to provide modulation, for the reduction in gain by application of a transverse field is accomplished by polarizing the carriers, with the result that a large displacement current must be accounted for. If the gain is reduced a significant fraction, the carriers must be polarized a distance on the order of one-half the width of the quantum well, and at frequencies of 40 GHz current densities on the order of several thousands of amperes per cm² would be needed to modulate a single quantum well laser.

In accordance with the present invention, a laser structure is provided which is a variation of the transverse junction laser of the type proposed by Yamanishi, et al. The structure consists of a high band-gap material such as AlGaAs which is grown without doping to avoid current conduction in it. Thereafter, P+ and N+ implants are provided on opposite sides of the material, leaving a narrow transition layer therebetween, on the order of 1 micron in width, to form a PIN junction. The transition layer is preferably on the order of less than 500 Angstroms thick, and contains the quantum well portion of the device. The quantum wells are formed during the growth of the structure by layers of GaAs on the order of 50 to 100 Angstroms thick, alternating with similar layers of AlGaAs, the preferred structure incorporating one to five GaAs layers, each layer extending between the P+ and the N+ implants, across the transition region. The P+ and N+ segments serve to inject electrons and holes into the quantum wells, to provide the necessary inversion for laser action. The fraction of current entering undoped AlGaAs material of the quantum wells at the boundaries between the N+ and P+ materials and the transition layer, as compared to the current entering the transition layer itself, is weighted by the thickness of the quantum wells in comparison to the thickness of the high band-gap material in the transition layer and by the Boltzman factor, $e^{-\Delta E/kT}$, where $\Delta E$ is the difference in the bandgaps between the undoped material and the N+ or the P+ implants. If, in the case of an AlGaAs system, a high enough mole fraction of aluminum is chosen for the barrier regions, a negligible fraction of the current will flow through the transition layers of AlGaAs.

The foregoing principle is illustrated in several different configurations, in accordance with the present invention. In two embodiments, a spatially inhomogenous electric field is applied transversely (i.e., perpendicularly to the direction of current flow between the P+ and N+ segments) across a quantum well by means of either a single, thin gate electrode or by means of a multigate structure. Another embodiment employs two or more nonidentical quantum wells in the same optical cavity. It will be understood that combinations of these various schemes are possible, in accordance with the invention.

BRIEF DESCRIPTION OF THE DRAWINGS

The foregoing and additional objects, features and advantages of the present invention will become apparent from a consideration of the following detailed description of preferred embodiments thereof, taken in conjunction with the accompanying drawings, in which:

FIGS. 12A through 12F illustrate unsaturated gain curves in each section of the device of FIG. 10, and the effective gain for different electric fields;

FIG. 13 is a diagrammatic illustration of the ground state wave functions and energy gain profiles for a device having thin and wide quantum wells;

FIGS. 14A and 14B illustrate unsaturated gain curves for the device of FIG. 13;

FIGS. 15A and 15B are energy band profiles for still another emobodiment of the present invention, showing zero field and applied field profiles, respectively;

FIG. 16 discloses another embodiment of the present invention utilizing a planar doped barrier configuration; and FIG. 17 illustrates an energy band profile for the device of FIG. 16 at zero applied field.

DESCRIPTION OF PREFERRED EMBODIMENTS

Figure 1:
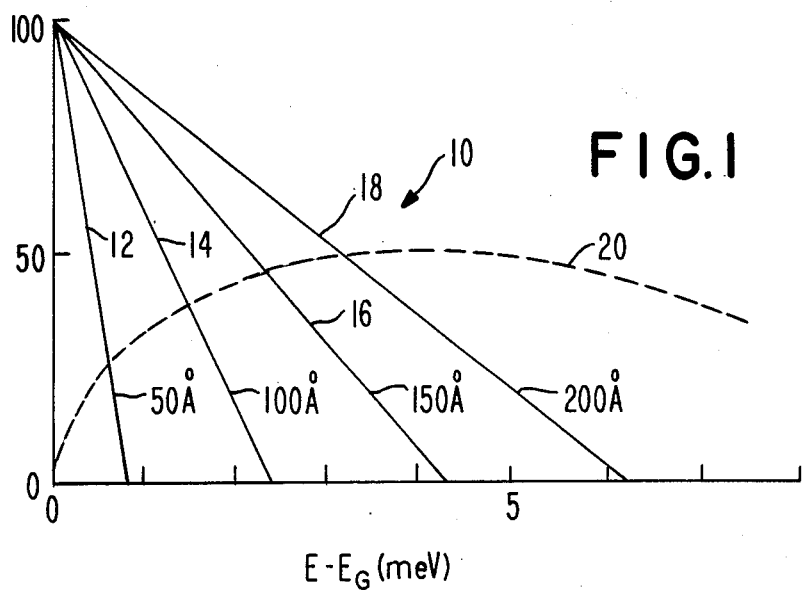
FIG. 1 is a graph of calculated quantum well gain spectra for an undoped GaAs quantum well.

Turning now to a more detailed consideration of the present invention, there is illustrated, in graphical form, in FIG. 1 the results of calculations of the optical gain curves for laser operation in a quantum well laser. The gain g is shown as a function of the photon energy E minus the bandgap $E_G$. These curves are calculated in accordance with equation 5, and are calculated for quantum well thickness of 50 Angstroms, shown by curve 12; 100 Angstroms, shown at curve 14; 150 Angstroms, at curve 16; and 200 Angstroms, at curve 18. The illustrated curves are calculated with an assumed peak gain of 100 cm.$^{-1}$, and are shown to be essentially linear and quite narrow. For comparison, the gain spectrum for the equivalent "bulk" laser, where the thickness of the material approaches infinity, is also given in FIG. 1 at curve 20. For curve 20, the optical confinement was considered to be twice as good as in the quantum well case, and shows a peak gain of only 50 cm$^{-1}$. The bulk gain spectrum, as shown, is approximately an order of magnitude greater than that for a quantum well structure having a width of approximately 50 Angstroms, even though the threshold gain in the quantum well case is twice as large as that in the bulk case. Thus, the spectrum of a quantum well device shows a much better gain discrimination than does the bulk device gain spectrum.

Figure 2:
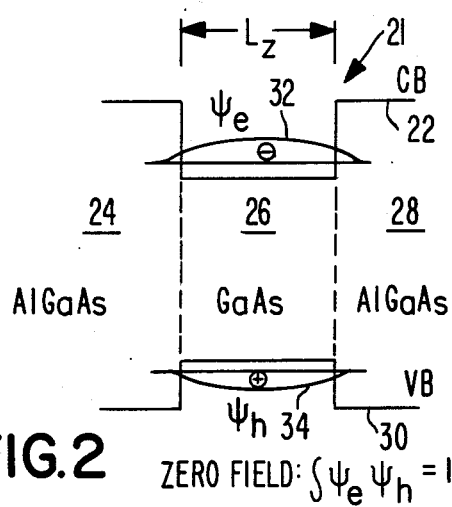
FIG. 2 is a diagrammatic illustration of the ground state wave function and energy gain profile in a quantum well with a zero applied field.

FIG. 2 illustrates the potential energy diagram of a quantum well 21 existing in PIN junction device. As shown, the potential energy of the conduction band 22 of the quantum well shows a sharp drop at the interface between the undoped AlGaAs material 24 and the undoped GaAs material 26 of the quantum well 21, and a corresponding sharp increase at the junction between the quantum well material 26 and the undoped AlGaAs material 28. The valance band, indicated at 30, shows a similar, but opposite, change in potential energy of the quantum well 21. Also, as illustrated, the wave functions 32 and 34 of the electrons and holes, respectively, are symmetrically distributed across the thickness $L_z$ of the quantum well 21, the thickness being measured in the direction of growth of the quantum well, and, preferably, being between 50 and 100 Angstroms.

Figure 3:
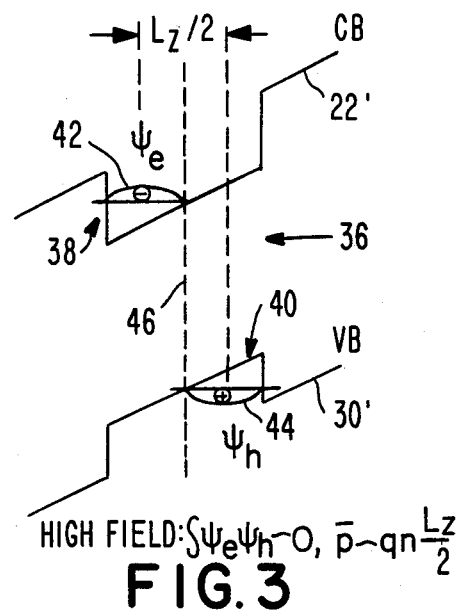
FIG. 3 is a diagrammatic illustration of a ground state wave function and energy gain profile for a high field applied to the quantum well device of FIG. 2.

The application of a transverse electrical field in the direction of arrow 36, normal to the direction of the well thickness, causes a sloping of the potential energy, as illustrated at 22' and 30' in FIG. 3. This results in triangular potential wells at 38 and 40, with minima at opposite ends of the well for the electrons and holes. If a strong enough field is applied, the electron and hole wave functions are localized, or polarized, to opposite sides of the well, as indicated at 42 and 44. This reduces the charge overlap from the 100 percent overlap shown in FIG. 2, for example, to the zero overlap of FIG. 3, where the opposite edges of waveforms 42 and 44 are essentially aligned with each other along line 46. The reduction of charge overlap reduces the peak gain of the device, until the quenching point is reached at zero overlap.

Figure 4:
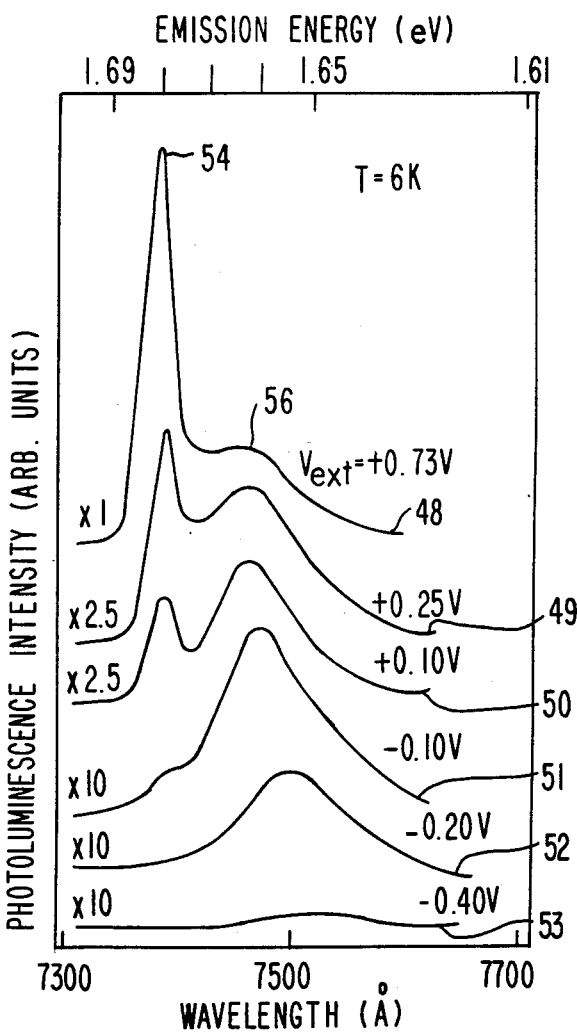
FIG. 4 is a graph of photoluminescent intensities for various applied voltages vs. wavelengths in the depletion region of a Schottky diode.

The quenching of impurity and exciton peaks in quantum wells located in the depletion region of a Schottky diode, as described by Mendez, et al. (ibid.), and discussed above, is illustrated in FIG. 4. As shown, by changing the voltage applied to the Schottky diode from a plus (+) value of 0.73 volts to a negative (−) value of 0.40 in steps, the electric field (36 in FIG. 3) across the quantum wells of the diode was varied to produce changes in the photoluminescence intensity, as illustrated by curves 48 through 53. The illustrated curves are for GaAs quantum wells, having a thickness of 35 Angstroms, with the quantum well device being excited by a laser beam at 6328 Angstroms. As shown at curve 48, two well-defined peaks 54 and 56 are produced at 1.681 eV, and 1.662 eV, respectively, the first being attributed to a free exciton recombination, and the latter involving the recombination of ground-state electrons. As shown by curves 48 to 53, as the terminal voltage which produced the electric field 36 was decreased, the intensity of both luminescence peaks decreased, although the one at higher energy did so at a much faster rate, and was completely quenched by the transverse electric field of curve 52. Furthermore, the change in field caused a shift of the energy of the peaks to lower energies as the external voltage was decreased from that of curve 48 to that of curve 52. This quenching appears to be due to the spatial separation of carriers induced by the electric field, as discussed with respect to FIG. 3, with the electron and hole wave functions being polarized away from the symmetrical configuration of FIG. 2. The results shown in FIG. 4 are for an increasingly negative externally applied voltage which produces an increasing total field, including both the built-in and applied field in the diode.

Figure 5:
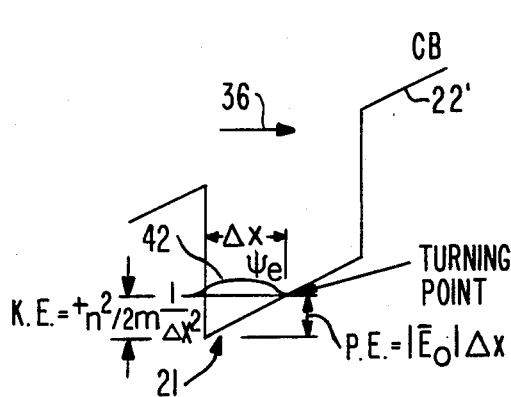
FIG. 5 is a diagrammatic illustration of the effect of an applied field to confine a wave function inside a quantum well.

As illustrated in the conduction energy band profile 22' of FIG. 5, the imposed electric field 36 confines the carrier, indicated by the wave function 42, to a distance $\Delta x$ from the edge of the quantum well 21. Then the kinetic energy (K.E.) of the carrier is defined as follows:

$$\frac{\Delta p^2}{2m^*} \cong \frac{\hbar^2}{2m^*\Delta x^2} \tag{6}$$

where the kinetic energy is the energy of a carrier within the quantum well, and wherein m* is the effective mass of the carrier.

Equating the kinetic energy and the potential energy (P.E.) at the turning point, illustrated in FIG. 5, produces:

$$\frac{\hbar^2}{2m^*\Delta x^2} = |\vec{E}|\Delta x, \tag{7}$$

where E is the applied electric field 36. For quenching, the electrons and holes must be completely polarized, so that $\Delta x$ must approximate one-half the width $L_z$ of the well 21. This produces an expression for the magnitude of the field needed for quenching, as:

$$|\vec{E}_o| = \frac{8\hbar^2}{m^*L_z^3} \tag{8}$$

The foregoing equation illustrates that quenching in prior narrow quantum well structures is difficult, and requires very high fields.

Figures 6A, 6B:
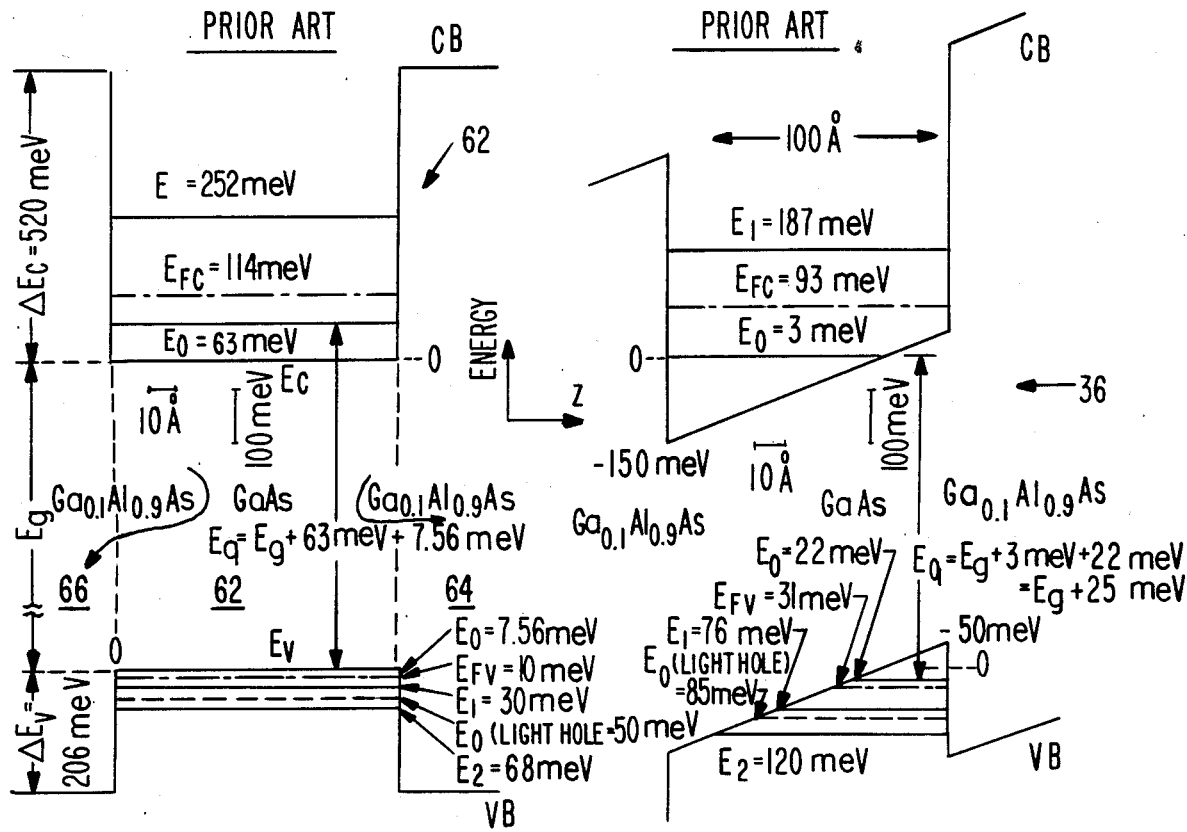
FIGS. 6A and 6B provide diagrammatic illustrations of the subband energies in a GaAs quantum well, showing the effects of zero electric field in 6A and a high transverse electric field at 6B.

The electric field applied tranversely across the PN junction of the diode also has the effect of shifting the subband energies, as illustrated in FIGS. 6A and 6B, and described in greater detail in Yamanishi, et al (ibid.). Although perturbation theory is strictly incorrect for high fields, this theory can be used to gain an idea of how the subband shifts start with an electric field, and their dependence on the various physical variables in the device. From quantum mechanical second-order perturbation theory is derived:

$$E_n = E_n^{(o)} + H'_{nn} + \sum_{i \neq n} \frac{|H'_{ni}|^2}{E_n^{(o)} - E_i^{(o)}} \tag{9}$$

or $$\Delta E = E_n - E_n^{(o)} = H'_{nn} + \sum_{i \neq n} \frac{|H'_{ni}|^2}{E_n^{(o)} - E_i^{(o)}}. \tag{10}$$

For the infinite barrier, or ideal quantum well, perturbed by the potential of a linear electric field, $\vec{E}$, the expression:

$$\Delta E_n = (|\vec{E}|L_z)^2 \frac{1}{E_1^o} \left(\frac{64}{\pi^4}\right) \sum_{i \neq n} \frac{i^2}{(n-i)^4(n+i)^4(n^2-i^2)} \tag{11}$$

is arrived at, with $$E_1^o = \frac{\hbar^2\pi^2}{2m^*L_z^2} \tag{12}$$

For the n=1 ground state, $E_i^{(o)}$ is greater than $E_1^{(o)}$, where i≠1, so that the ground state will have a negative shift, and the shift will begin with a dependence on $$(|E|^2L_z^4) \tag{13}$$

The shift in the subband energies has been calculated for a GaAs quantum well 100 Angstroms thick, and having $Ga_{.1}Al_{.9}As$ barriers, as shown in FIGS. 6A and 6B. FIG. 6A illustrates the subband energies with no applied field, while FIG. 6B illustrates the subband energies for an applied field of $2 \times 10^5$ volts per cm. As shown, the total shift in both the electron and the heavy hole band is $-45.56$ meV.

Figure 7:
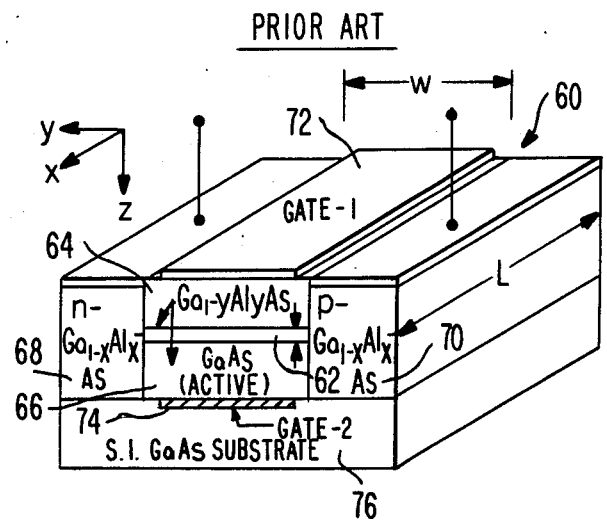
FIG. 7 is a diagrammatic illustration of a prior art structure producing the subband energy effects illustrated in FIGS. 6A and 6B.

The device that produces the quantum well shifts illustrated in FIGS. 6A and 6B is shown in FIG. 7 as being a semiconductor laser device 60. This device includes a very thin GaAs active layer 62, covered by insulating GaAlAs layers 64 and 66. Layers 62, 64, and 66 extend between N and P regions 68 and 70, respectively, formed in the AlGaAs material, and electric fields perpendicular to the injection current, which flows between the N and P regions, are applied through the insulating layers 64 and 66 by gates 72 and 74. The gates extend across substantially the entire width W of the quantum well 62, and the entire device is mounted on a substrate 76 of semi-insulating GaAs.

When a sufficiently high positive voltage is applied to the upper gate electrode 72, and a negative voltage with a similar magnitude is applied to the lower gate electrode 74, the injected electrons and holes are accumulated at the upper and lower sides, respectively, of the active layer 62. The spatial separation of the carriers brings about a reduction in photon emission from the device, as previously explained. In accordance with Yamanishi, et al., the active layer 62 is chosen to be around 100 Angstroms in vertical thickness, as viewed in FIG. 7, since an electric field cannot penetrate into the inner regions of a thick layer, and, further, because a thinner layer would cause the wave functions of the accumulated electrons and holes to overlap spatially, resulting in no significant change in the device.

Devices of the type illustrated in FIG. 7 require high fields to achieve a significant reduction in gain, and such fields, in reducing the subband energies relative to the quasi Fermi energies, cause more charge to flow into the well, and, thus, increase the term $F_c - F_v$ of the gain equation 5. In the device of FIG. 7, at a field of $2 \times 10^5 V$ per cm, this fact increases the carrier density by a factor of 1.75, and increases the peak gain from 25 percent of the zero field value to 30 percent of the zero field value. Such a device also requires large microwave currents in order to obtain modulation, since the reduction in gain is accomplished by polarizing the carriers, resulting in a large displacement current within the quantum wells. To produce a significant reduction in gain, the carriers must move a distance on the order $L_z/2$, and with a high density of electrons or holes, this produces a significant current. As has previously been stated, at frequencies of 40 GHz or more, current densities on the order of several thousands of amperes per square centimeter would be needed to modulate a single quantum well laser of this type.

Figure 8:
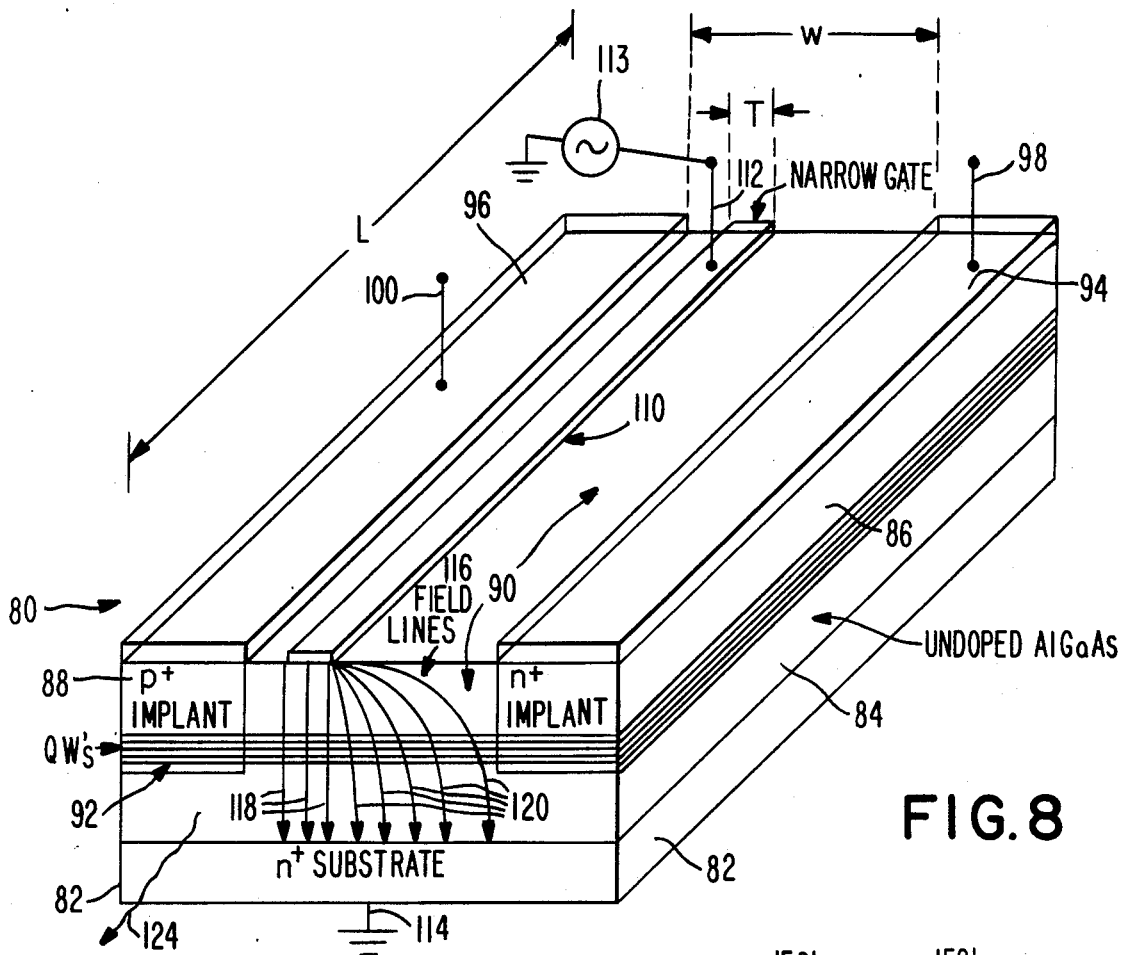
FIG. 8 is a diagrammatic illustration of a quantum well device in accordance with the present invention.

The foregoing difficulty is overcome, in accordance with the present invention, by the laser structure 80 illustrated in FIG. 8. This structure 80 is a variation of the device of FIG. 7, and includes a substrate 82 on which is grown a block 84 of semi-insulating, undoped, high bandgap material such as AlGaAs. The block 84 is undoped to avoid current conduction in it. Implants of P+ and N+ materials indicated at 86 and 88, respectively, are provided to produce a PIN diode, in known manner, having a transition region 90 therebetween, in which is formed one or more quantum wells 92. Ohmic contacts 94 and 96 are formed on the top surfaces of the P+ and N+ implants, respectively, to which lead lines 98 and 100, respectively, are connected. The P+ and N+ implants inject electrons and holes into the quantum wells 92 to provide the necessary inversion for laser operation. The quantum wells are thin layers of undoped GaAs formed in the AlGaAs material during growth of the semiconductor structure, with each quantum well layer being 50 to 100 Angstroms thick in the direction of growth. Interposed between adjacent quantum well layers are layers of undoped AlGaAs between about 50 and about 100 Angstroms thick. Multiple quantum layers, preferably up to 5, are formed, to a total thickness of about 1000 Angstroms, including both the quantum wells and the intermediate AlGaAs layers.

Electrons will flow from the N+ implant material into the transition region 90 of the undoped AlGaAs material 84. The N+ implant material also injects electrons into the quantum well layers 92 lying in the transition region 104. In similar manner, holes are injected by the P+ implant material 86 into the transition region 90, entering both the undoped AlGaAs material 84, and the quantum wells 92. The fraction of current entering the quantum wells 92, compared to the current entering the high bandgap material 90, is weighted by the comparative thicknesses of each section, as viewed in FIG. 8, and by a Boltzman factor which is related to the difference in the bandgaps between the N+ material 88 and the transition region 90, and between the P+ material 86 and the transition region 90. If a high enough mole fraction of the impurity, such as aluminum in the case of an AlGaAs system, is chosen for the barrier regions adjacent the N+ and P+ implant regions, a negligible fraction of the current will flow through the material 90. The device thus far described serves as the basic structure for the various configurations of the present invention.

In accordance with one embodiment of the present invention, the PIN diode 80 includes a narrow electrode 110 on the surface of region 90, to which a lead 112 is connected for the application of a voltage which will provide a transverse field across the quantum wells 92. A variable source 113 of high-frequency voltage is connected to the electrode 110 via lead 112, to provide a transverse electric field which varies at selected microwave frequencies and amplitudes to modulate the laser action of the diode at the selected frequency. The substrate 82 in this case is an N+ material which is connected to a ground reference point at 114; and upon application of a voltage to lead 112, the field lines generally indicated at 116 will be produced. In the illustrated embodiment, the width T of the gate 110 is less than the distance W between the N and P implants 86 and 88.

The electric field between gate 110 and substrate 82 may be direct, as indicated by field lines 118, or may include fringing field lines 120. Depending on the geometry of the narrow gate 110 and of the diode 80, the fringing of the field across the width W will vary. In a first embodiment, the structure of the device may be such that the electric field can be approximated as being uniform beneath the gate, as indicated by only the field lines 118, with the fringing effect of field lines 120 being small so that the field is essentially zero elsewhere across the width of the transition region 90. In this condition, with no electric field initially applied between the gate 110 and the substrate 82, the unsaturated gain of the laser in normal operation, with a bias applied across lines 98 and 100, and upon the application of an excitation beam of light 122, would be above threshold and sufficient to produce an output laser beam 124. Thus, the normal gain would be have the general shape illustrated at 126 in FIG. 9A.

If a voltage of sufficient magnitude from source 113 is applied to the gate 110 by way of line 112, so that an electric field, represented by lines 118, is applied across the quantum wells 90, the field 118 would shift the energy subbands of the wells 92, and, consequently, the gain curve, over that portion of the laser transition region 90 which is covered by the narrow gate 110. If, for example, the gate covered one-half the width W of the transition region between the P+ and N+ implants (T=W/2), the energy subbands and the gain curve would be shifted in energy over a corresponding one-half of the laser upon application of a voltage to the gate, but would remain unshifted for the rest of the laser. In this mode of operation, the gain vs. energy curve would be different at different points across the width W of the laser. If a high enough field is applied to shift the gain curve for the material under the narrow gate 110 by an amount on the order of the maximum width of the curve 126, the effective gain vs. energy curves 128 and 130 of FIG. 9B would result, curve 128 representing the quantum wells under the gate, and curve 130 representing the quantum wells not under the gate. The effective peak gain for this mode of operation (referred to as the transverse mode) would thus be reduced by a factor of 2. The effective gain for the transverse mode can be defined as $$g_{eff}(h\nu) = \frac{1}{w} \int_0^w g(h\nu, w') dw' \quad (14)$$

The magnitude of the transverse field required to shift the gain curve by an amount equal to its width to produce the factor of 2 reduction can be significantly lower than the magnitude of the transverse field required to produce the shifting which produces the high field, nonoverlap condition illustrated in FIG. 3. For example, calculations for a quantum well 30 Angstroms thick indicate that a shift in the gain curve of 1 meV can be obtained at an effective field of $5 \times 10^4$ volts per cm., and this would reduce the effective gain in the device of the prior art, as illustrated in FIG. 3, by about three percent. However, an effective field of $5 \times 10^4$ V per cm. in the device of FIG. 8 reduces the effective gain by 50 percent. Thus, the narrow gate structure of FIG. 8 is capable of modulating a laser with a lower transverse field, and, thus, a lower field voltage, and with lower polarization displacement currents, was possible with the prior art device illustrated in FIG. 7, thus enabling the device to operate at microwave modulation frequencies.

Figure 9A:
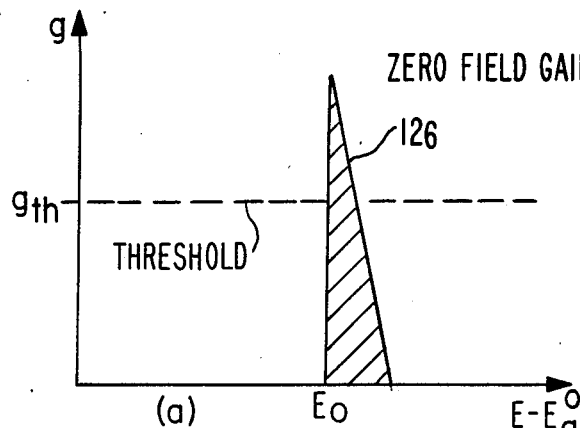
FIGS. 9A, 9B, and 9C show unsaturated gain curves for the narrow gate device of FIG. 8.
Figure 9B:
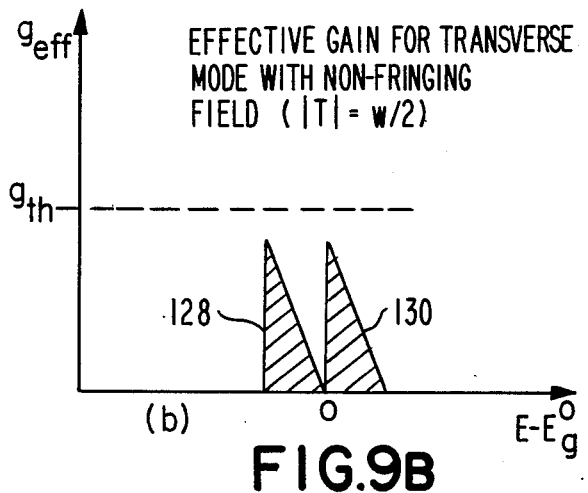
Figure 9C:
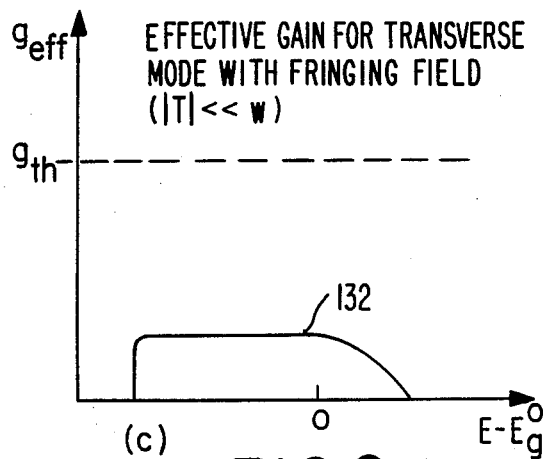

A narrow gate structure designed to provide fringing fields of the type illustrated at 120 in FIG. 8, as well as the field lines 118, could reduce the gain even more, for if the transverse, or perpendicular, component of the electric field varies continuously across the width of the transition layer 90, the effective gain curve is scattered, or "smeared," and the peak energies are significantly reduced. This is illustrated in FIG. 9(c) by the curve 132.

In addition to the foregoing shifts in energy subbands and gain curves, a high enough field applied to the narrow gate 110 will begin to shift the gain curves down in energy to the point that the device becomes lossy for the photon energy $E_g^{(o)}$; that is, the section under or near the gate becomes absorptive to the photons which are built up under zero field conditions.

In operation, the PIN junction device 80, or PIN diode, in the absence of a transverse electric field, operates in the normal way to produce laser action. The application of a transverse field by means of gate 110 quenches the laser output, effectively absorbing the input photons. The selective application of the transverse field thus permits modulation of the output light produced by the diode. Because of the use of an essentially nonconductive, undoped material for the diode body 84, modulation can be produced at microwave frequencies in a simple and economic way, with lower voltages and lower internal currents than previously was possible.

Figure 10:
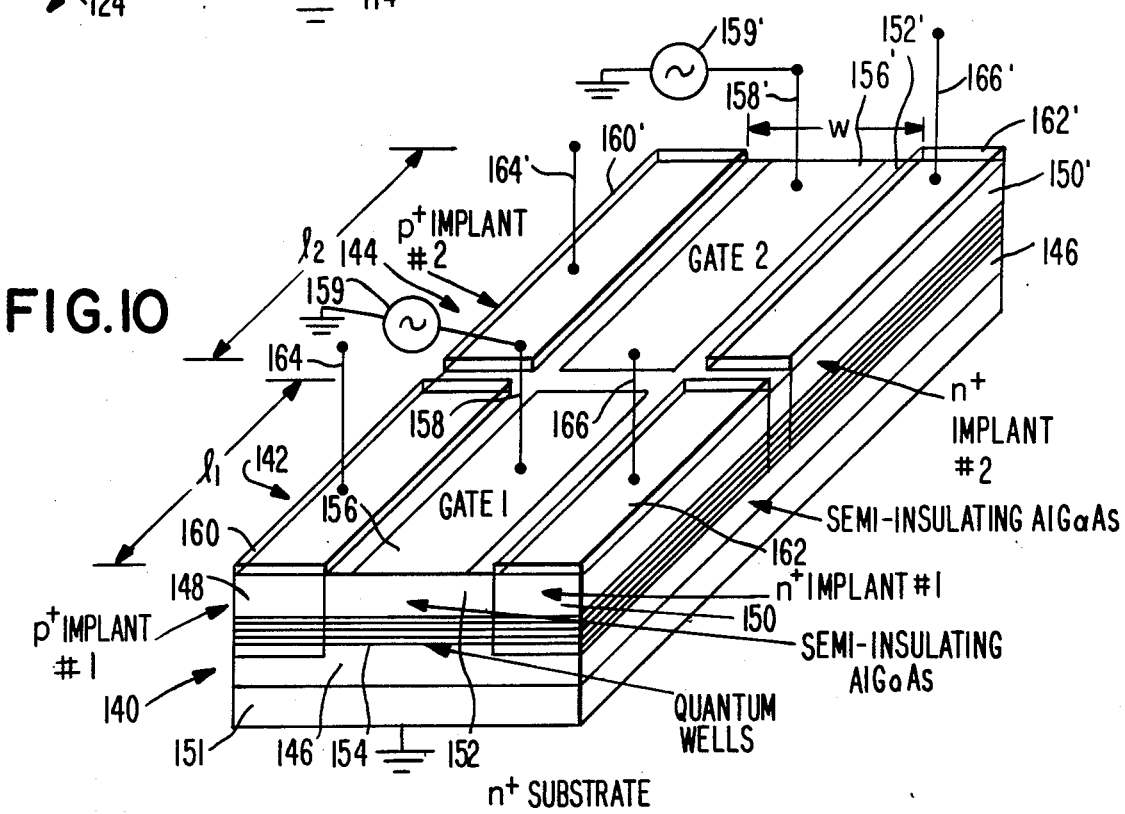
FIG. 10 is a diagrammatic illustration of a multigate device in accordance with another embodiment of the present invention, showing separate control of the diode biasing and of the transverse electric field in each section of the device.

A modification of the present invention is illustrated at 140 in FIG. 10, which illustrates a multigate device formed side-by-side from one semiconductor body on a single substrate. Such a device permits the application of spatially inhomogeneous transverse electric fields to provide different modes of operation. A two-section, two-gate PIN diode 140 is illustrated, the device incorporating a first section 142 having a length $l_1$, and a second section 144, which is a duplicate of section 142, having a length $l_2$. Each section has separate P and N implants, so that the biasing of the diode 140 can be separately controlled in each of the two sections 142 and 144. Further, each section has a separate gate electrode so that the current density and transverse electric field can be individually controlled in each section of the laser by means of respective modulating sources, such as suitable microwave frequency sources. Thus, section 142 of the diode includes a body 146 of semi-insulating, undoped, high bandgap GaAlAs, containing spaced P+ and N+ implants 148 and 150, respectively, and mounted on an N+ type substrate 151. The implants define a transition layer 152 therebetween, which is a part of the body 146, and which contains one or more quantum wells 154. A first gate electrode 156 is located on the transition region 152, and is connected by way of an input lead 158 to a modulating voltage source 159. The gate is positioned between a pair of ohmic contacts 160 and 162, located on the surfaces of the implants 148 and 150, respectively. The contacts are connected to leads 164 and 166, respectively, whereby a DC biasing potential can be applied across the PIN device. As before, the AlGaAs body 146 is an undoped material to reduce current conduction in that portion of the transition layer 152 which does not include the quantum wells.

Section 144 of the multigate device is a duplicate of section 142, but spaced longitudinally along the length of the body 146, as illustrated in FIG. 10. Corresponding elements in section 144 are indicated by primed numerals corresponding to the numerals in section 142. Although two sections are illustrated in FIG. 10, it will be apparent that additional sections can be added, as desired.

Each of the sections 142 and 144 provides independent control of the DC voltage across their respective PIN diode segments and independent control of the AC voltage on their respective gates, so that a structure with n gate sections has 4n modulation variables, as opposed to the two variables which are available in a normal PN semiconductor laser. Consequently, many additional modes of operation are possible with multigate devices. A few of these modes will be described hereinbelow.

Figure 11A:
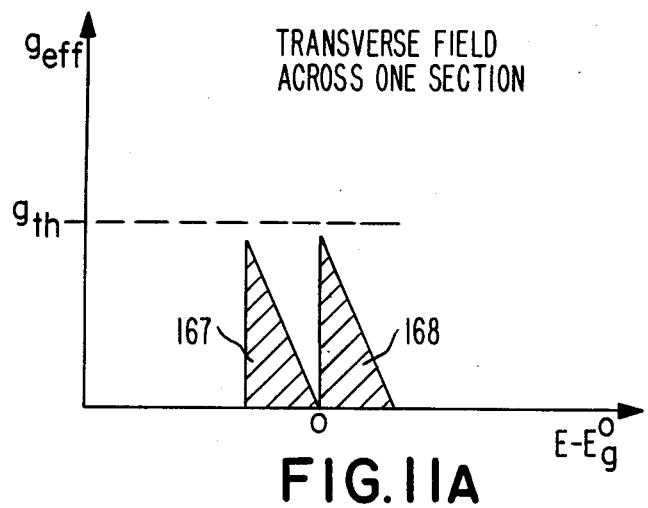
FIGS. 11A and 11B show gain curves for the device of FIG. 10 with a transverse field applied to one sector.
Figure 11B:
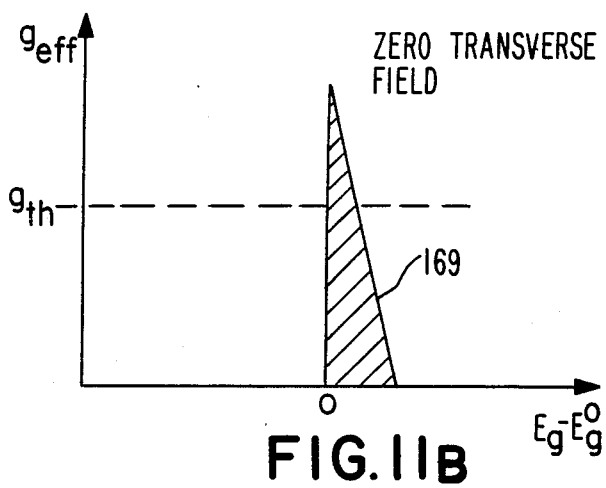

The simplest modulation scheme for the device of FIG. 10 is to apply a transverse field across only one of the sections 142 or 144 of the multigate structure, by applying a modulating voltage to the corresponding gate for that section. Both sections would be biased across their respective PIN junctions, so that the two diode sections each would have almost enough gain to support laser operation. The modulating field is applied across one of the sections (e.g., 142), so that the gain curve 167 of that section is shifted (see FIG. 11A) with respect to the gain curve 168 of the other section 144 enough to prevent lasing. Turning the transverse field off would then align the gain curves for the two sections, resulting in an effective gain well above the laser threshold, as shown by curve 169 in FIG. 11B. This operation is illustrated in FIG. 9A.

The threshold condition for laser operation in a multigate structure may be explained as follows. In one roundtrip of a photon travelling through the semiconductor device, being reflected from an endface and returning, the photon should return with the same intensity; that is:

$$\Gamma = R_1 R_2 \exp \Gamma \sum_i 2 g_i(h\nu, |\vec{E}_i|) L_i \quad (15)$$

where $R_1$ and $R_2$ are the reflectivities of the endfaces, $\Gamma$ the optical confinement, $L_i$ the length of the ith section, $|\vec{E}|$ the magnitude of the electric field in the ith section, and the function $g_i(h\nu, |\vec{E}|)$ gain in the ith section for a photon of energy $h\nu$ with electric field $|\vec{E}_i|$ applied across the quantum well in the ith section. In general, $g_i(h\nu, |\vec{E}_i|)$ can be positive or negative, depending on the diode and gate biasing, and the energy of the photon. The average, or "effective" gain for a longitudinal mode can be defined as:

$$g_{eff}(h\nu) = \frac{\sum_i g_i(h\nu, |\vec{E}_i|) L_i}{\sum_i L_i} \quad (16)$$

where the threshold condition is expressed as $$1 = R_1 R_2 \exp(\Gamma g_{eff}(h\nu) \epsilon L_i) = R_1 R_2 \exp(\Gamma g_{eff}(h\nu) L) \quad (17)$$

The shifting of the gain curves due to the transverse electric field can thus change the effective gain at a particular photon energy.

In the two-gate structure of FIG. 10, $$g_{eff}(h\nu) = \frac{g_1(h\nu, |\vec{E}_1|) L_1 + g_2(h\nu, |\vec{E}_2|) L_2}{L_1 + L_2} \quad (18)$$

for moderate field strengths, the electric field essentially shifts the triangular gain curve to a lower energy. If the gain curve is shifted the order of its width by a field $|\vec{E_o}|$, then we can have the situation $g(h\nu_o, |\vec{E}|=0) = g+h$, but $g(h\nu_o, |E_o|) = 0$. If each section is biased such that each section could almost support lasing in the cavity by itself, i.e., $1 \sim R_1 R_2 \exp(\Gamma g_i L_i)$, then the shifting caused by the electric field allows the effective gain at a particular photon energy to vary from zero to far above threshold, depending on the voltages of all of the gates in the device.

The foregoing concept is demonstrated in FIG. 12 for the two-gate device 140. In the "off" mode, illustrated in FIGS. 12A–12C, section 142 (for example) has zero electric field applied, and its gain curve 170 begins at $E_g^o$, which is not the desired lasing electric field $E_{las}$. The second section (144 in FIG. 10) has a field $E_w+\delta$ strong enough to shift its gain curve 172 the order of its width plus $\delta E$ (see FIG. 12B). The effective gain (FIG. 12C) at $E_{las} = E_g^o - \delta E/2$ and is zero in the off mode. In the "on" mode, shown in FIGS. 12D through 12F, an effective field $E\delta/2$ is applied to section 142, by way of gate 156, strong enough to shift the gain curve 170 to $E_{las}$. The field applied to section 144 by way of gate 156' is simultaneously reduced to $E\delta/2$, shifting its gain curve 172 up to $E_{las}$. Consequently, the effective gain for the longitudinal mode at $E_{las}$ rises to far above the threshold $g_{th}$, as shown by the effective gain curve 174 in FIG. 12F, and lasing at energy $E_{las}$ will begin. When the laser is shifted back into the off mode by changing the applied fields, the photon population built up at energy $E_{las}$ will see no gain, and will decay to zero in a photon lifetime of about 3–5 ps. in the optical cavity.

One section of the multigate structure of FIG. 10 can be used as a high-speed variable optical absorber. This is accomplished by operating the diode in one modulator section in reverse bias, so that the charge density in the quantum well of that section is insignificant. In this situation, the energy levels in the quantum well can be shifted with only negligible polarization displacement current. The remaining sections of the laser can be biased so that the laser photon energy is shifted downwardly by an amount on the order of the excitonic binding energy for the material. With a zero transverse field on the reverse-biased modulator section, stimulated photons in the quantum well would experience no excitonic or intrinsic loss in the modulator section, and the optical absorption in the modulator section would be small at the stimulated photon energy. Increasing the modulator voltage to increase the transverse field would then increase the optical absorption, as excitonic and intrinsic absorption became possible in the modulator at the lasing energy.

A section of the multigate device 140 can also be used as an absorbing modulator by applying a high electric field in the plane of the quantum wells. This causes the exciton peaks to be lowered in energy (due to the electron absorption by the Stark effect), and the absorption edge moves down in energy. Increasing the reverse bias on the diode would increase the absorption at the lasing energy. Large changes can be obtained if the laser photon energy in the other sections of the multigate device were to be shifted by the application of appropriate voltages.

Multiple quantum well structures may also be devised with effective gain curves which can experience large changes in the gain at the lasing energy for only modest changes in applied field. This can be accomplished by providing quantum wells which shift differently in energy with applied field, so that the effective optical gain would be given by $$\Gamma g(h\nu) = \sum_i \Gamma_i g_i(h\nu, |\vec{E}|) \quad (19)$$

where $\Gamma_i$ is the fraction of optical energy of the mode contained in the ith well. If the wells are designed to shift in energy at different rates, it is possible to change the gain at energy $h\nu_0$ from zero to far above threshold. Thus, since energy shifts are proportional to $$(|\vec{E}|^2 L^4) \quad (20)$$

then a thin and a thick quantum well in the same semiconductor body will shift at different rates; the thick well will shift at a much faster rate than the thin well. If a quantum well is made of $Al_xGa_{1-x}As$ -$Al_yGa_{1-y}As$ (y being <x), the energy levels of the quantum well can be increased by increasing y. A thicker $Al_yGa_{1-y}As$ quantum well could thus have a larger effective energy gap than a thinner GaAs quantum well. If the effective energy gap of the thick well is larger than the effective energy gap of the thin well by an amount equal to the width of the gain curve for the thin well, then at zero field the gain curves would not overlap, and the effective gain would be small. An applied field would shift the thick well further than the thin well, and at a high enough field, the curves would overlap and the effective gain would be high. Since both curves are shifted down in energy by the field (but are not equally shifted), this peak effective gain would occur at an energy which, at zero field, has no gain. FIGS. 13, 14A, and 14B illustrate such a device for a thin quantum well, indicated at 178 in FIG. 13 as being 30 Angstroms wide, and a thick quantum well 182, shown as being 100 Angstroms thick. As shown in FIG. 14A, under zero field conditions the thin well 128 exhibits the gain curve 184, while the thick well 182 exhibits the gain curve 186.

As illustrated in FIG. 14B, upon application of a transverse field of $5 \times 10^4$ V/cm, the gain curve 184 for the 30 Angstrom well 178 would shift 1 meV, while the gain curve 186 for the 100 Angstrom well 182 would shift 7.6 meV. If enough Al mole fraction is used to make the effective energy gap of the 100 Angstrom well 6.6 meV greater than that of the 30 Angstrom well, as illustrated in FIG. 14A, the indicated transverse field will align the gain curves 184 and 186 to produce the effective gain curve 188 of FIG. 14B, thereby producing a large, effective gain for the device.

FIGS. 15A and 15B illustrate, at 189, the energy band profile for another two-section device, wherein the quantum wells are formed either by grading the AlGaAs in the quantum well, as indicated by the two wells 190 and 192, or by using a planar doped barrier (PDB) configuration with P+ planar doping in the cladding region between wells, and N+ layers outside the wells. In either case, a built-in electric field exists in each quantum well to produce the zero transverse field energy band profile of FIG. 15A. By using such grading techniques or by using a planar doped barrier configuration, it becomes possible to grow a multiple quantum well structure which, at zero applied field, has effective electric fields in each of the wells 190 and 192 with different directions and/or magnitudes. In such a case, the effective gain is given by $$\Gamma_g(h\nu, \vec{E}) = \Sigma \, \Gamma_{gi}(h\nu, |\vec{E}_i^{eff} + \vec{E}_i^{app}|) \quad (21)$$

where the gain in a given well depends on an electric field which is the superposition of the applied transverse field $E^{app}$ and the effective field $E^{eff}$ across the well due to grading or to the PDB configuration. As illustrated in FIG. 14A, the wells 190 and 192 have effective fields of equal magnitude, but opposite direction. An applied transverse electric field would, as a consequence, flatten the energy band profile of well 190, as indicated at 190' in FIG. 15B, while giving the other well 192 a steeper triangular potential, as illustrated at 192' in FIG. 15B. The gain curves for the two sections, which at zero field would have been aligned, would then move in opposite directions when an electric field was applied.

FIG. 16 illustrates in diagrammatic form a quantum well device formed by using a planar doped barrier (PDB) configuration, wherein a pair of N+ layers 194 and 196 are located outside quantum wells 198, 199, 200, and 201 formed in the AlGaAs body 202. A P+ planar doping layer 204 is produced in the cladding region between wells 199 and 201. As previously indicated, this arrangement produces a built-in electric field in each well, as indicated by the energy band profile of FIG. 17 at 198', 199', 200' and 201'. The application of a transverse electric field to the device of FIGS. 16 and 17 produces a result similar to that illustrated in FIG. 14B, flattening the energy band profile of wells 198' and 199', while giving the other wells a steeper triangular potential. Again, the gain curves, which at zero field would be aligned, would then move in opposite directions when an electric field is applied.

It should be noted that in all of the foregoing devices, optical confinement will benefit the operation. Increasing optical confinement reduces the necessary peak gain, which reduces the gain curve width which is needed for laser operation. A structure with good optical confinement can then operate at lower electrical fields and with a correspondingly lower charge polarization and microwave current.

Although the present invention has been described primarily in terms of AM modulation schemes, FM modulation is also possible by shifting the emission energy. Thus, in the multigate structure, the energy at which lasing commences can be varied by changing the gate voltages. Modulation schemes are also possible with the present invention, which would allow a laser device to operate at two different frequencies. Thus, for example, a three-gate structure could be provided with one section biased at a low voltage, and another at a higher voltage. If the gain curves of these two sections were separated far enough apart in energy, then the voltage applied to a third section, and thus the energy shift imposed on that section, would determine whether the device would lase at the frequency of the lower or of the higher voltage, since lasing would commence when the third section gain curve was aligned with the gain curve of one of the other two sections. Similarly, in the nonidentical structures illustrated by the energy band profiles in FIGS. 15A, 15B, and 17, shifting between frequencies can be obtained by using several well widths which would permit several frequencies to be produced whenever two gain curves are aligned by the application of appropriate electric fields.

Thus, as has been described herein, energy level shifting in a semiconductor quantum well by a transverse field applied to the well can be used to modulate a quantum well laser. High-speed modulation can be obtained through the use of significantly lower electric fields and lower microwave frequency currents, than has been possible in structures of the prior art. Although the invention has been described in terms of preferred embodiments, it will be understood that variations and modifications may be made without departing from the true spirit and scope of the invention, as set forth in the following claims.

What is claimed is:

1. An improved semiconductor laser device for modulation at microwave frequencies, comprising:
   a substrate;
   an undoped semiconductor body on said substrate;
   a P type section and an N type section formed in said semiconductor body, said P type and N type sections being separated by a narrow transition layer of said undoped semiconductor body and forming a PIN diode;
   means for applying a bias voltage across said PIN diode;
   a quantum well formed in said transition layer between said P type and N type sections, said bias voltage producing in said quantum well a population inversion between said P type and N type sections for producing laser action in said semiconductor body;
   electrode means on said transition layer;
   means for applying a microwave frequency alternating voltage to said electrode means to produce an electric field in said transition layer normal to said quantum well current path, said electric field being of sufficient magnitude to produce selective energy shifts in the gain spectra of said semiconductor in the region of said quantum well and to thereby modulate said laser.

2. The laser of claim 1, wherein said electrode means comprises a conductive layer on said transition layer between said P type and said N type sections.

3. The laser of claim 1 wherein said electrode means comprises a plurality of conductive layers on said transition layer.

4. The laser of claim 1, further including a plurality of P type sections and a plurality of N type sections defining a plurality of PIN diode sections longitudinally spaced along said semiconductor body, and wherein said electrode means comprises a plurality of electrode sections, one for each of said PIN diode sections, each electrode section comprising a conductive layer on the transition layer between the P type section and N type section for a corresponding said PIN diode section.

5. The laser of claim 4, comprising means for applying an independent microwave frequency voltage to each said electrode section to produce an independent transverse electric field in each said PIN diode section, said independent voltages each being capable of producing selective energy shifts in the gain spectra of their corresponding PIN diode sections, said independent voltages being of sufficient magnitudes and directions as to cooperatively modulate the laser action of said laser device.

6. An improved microwave frequency transverse junction semiconductor laser, comprising:
   an undoped AlGaAs semiconductor body;
   a P type section and an N type section in said body and spaced apart by a narrow transition region of said undoped AlGaAs body, to form a PIN diode;
   at least one GaAs quantum well within said transition region;
   means for applying a bias voltge across said PIN diode to produce in said quantum well a population inversion for supporting laser action in said semiconductor body; and;
   means for applying a variable microwave frequency electric field transversely to said quantum well, said field being of sufficient magnitude to produce an energy shift in the gain spectrum of said quantum well, whereby said laser action is modulated at microwave frequencies.

7. The laser of claim 6, further including a plurality of GaAs quantum well layers within said transition region, each said layer being between about 50 and about 100 microns thick and extending across said transition region between said P type section and said N type section.

8. The laser of claim 7, wherein adjacent said quantum well layers are separated by layers of undoped AlGaAs between about 50 and about 100 microns thick.

9. The laser of claim 6, wherein said means for applying a field transversely to said quantum well includes electrode means on said transition region between said P and N type sections.

10. The laser of claim 9, wherein said means for applying a field transversely to said quantum well includes a variable source of microwave frequency voltage.

11. The laser of claim 9, wherein said electrode means is substantially narrower than the width of said transition region, whereby the electric field applied to said quantum well varies across the width of said transition region to produce different energy shifts in different portions of said quantum well.

12. The laser of claim 11, further including a plurality of GaAs quantum well layers, adjacent said quantum well layers being separated by layers of undoped AlGaAs, said layers each being about 50 and about 100 microns in thickness.

13. The laser of claim 12, wherein said plurality of GaAs quantum well layers includes up to 5 layers.

14. The laser of claim 13, wherein said electrode means is about one-half the width of said transition region.

15. The laser of claim 6, further including a plurality of P type and N type sections formed in said AlGaAs semiconductor body and including plural bias voltages applied across said P type and N type sections to form plural PIN diodes, said means for applying an electric field transversely to said quantum well including an electrode on the transition region for each of said plural PIN diodes, whereby laser action of said semiconductor laser is modulated individuallly in each PIN diode formed on said semiconductor body to cooperatively modulate the laser action of said laser.

16. The laser of claim 15, wherein said means for applying an electric field includes corresponding, independently variable sources of microwave frequency voltage connected to each said electrode for independently producing selected energy shifts in the gain spectrum of said quantum well associated with each PIN diode, said energy shifts being selected to cooperatively provide modulation of said laser.

* * * * *